United States Patent [19]

Harrison

[11] 4,228,411
[45] Oct. 14, 1980

[54] BROADBAND FREQUENCY DIVIDER IN WAVEGUIDE

[75] Inventor: Robert G. Harrison, Montreal, Canada

[73] Assignee: Com Dev Ltd., Dorval, Canada

[21] Appl. No.: 26,765

[22] Filed: Apr. 3, 1979

[51] Int. Cl.³ ............................................. H01P 1/20
[52] U.S. Cl. .................................. 333/218; 333/219; 363/158
[58] Field of Search ......................... 333/218; 363/158

[56] References Cited

U.S. PATENT DOCUMENTS

| | | | |
|---|---|---|---|
| 3,060,365 | 10/1962 | Crandell | 333/218 |
| 3,281,647 | 10/1966 | Hines et al. | 363/158 |
| 3,307,099 | 2/1967 | Weller et al. | 333/218 |

Primary Examiner—Paul L. Gensler

[57] ABSTRACT

The invention relates to a broad bandwidth frequency divider which converts a band of input frequencies into a band of output frequencies such that each output frequency is one half the corresponding input frequency. The frequency divider has a first rectangular waveguide which propagates the band of input frequencies and a second larger rectangular waveguide which propagates the band of output frequencies. The two waveguides are orthogonally disposed with respect to one another and are interconnected by a slot provided in a common wall. Two nonlinear capacitive reactances are mounted in the first waveguide, one on each side of the slot, forming a transverse resonator. When the two nonlinear reactances are pumped in phase at the input frequency, parametric subharmonic resonance can be excited transversely at one half the input frequency such that the nonlinear reactance voltages are 180° out of phase at the output frequency. A corresponding subharmonic voltage developed across the slot is coupled directly into the output waveguide. The symmetry of the arrangement isolates the input frequency from the output port whereas the low-frequency cutoff property of the first waveguide isolates the output frequency from the input port. An arrangement is provided for biasing the nonlinear capacitive reactances.

9 Claims, 5 Drawing Figures

BROADBAND FREQUENCY DIVIDER IN WAVEGUIDE

The present invention generally relates to broadband frequency dividers capable of operating at microwave frequencies and more particularly to devices effecting a frequency division by two of bands of microwave frequencies propagating through waveguide transmission mediums.

Up till now, several microwave frequency dividers of various types have been proposed in the art as for example by L. C. Upadhyayula et al in "Microwave Frequency Dividers", RCA Review, Vol. 34, December 1973, pp. 595–607; by S. V. Ahamed et al in "Study and Fabrication of a Frequency Divider-Multiplier Scheme for High-Efficiency Mircowave Power", IEEE Transactions on Communications, Vol. COM-24, No. 2, February 1976, pp. 243–249; and A. D'Ambrosio et al in "Parametric Frequency Dividers: Operation and Applications", 3rd European Microwave Conference, 1973. Generally, the proposed devices do provide an output signal which has a frequency half the frequency of an input signal, but they provide a substantially narrow bandwidth, usually less than 15% fractional bandwidth, do not operate at high microwave frequencies and offer a relatively high harmonic content in the output signal due to the use of unbalanced circuits. More recently, an improved configuration was proposed by R. G. Harrison in "A Broadband Frequency Divider Using Microwave Varactors", IEEE Transactions on Microwave Theory and Techniques, Vol. MTT-25, No. 12, December 1977, pp. 1055–1059. The latter configuration employs a matched pair of varactor diodes in a balanced microstrip/coplanar circuit to yield near-octave bandwidth for input frequencies up to 8.0 GHz. However, although that design is considered a substantial improvement over other known prior art devices, there still exist isolation problems between the input and output frequencies which is limited by the residual asymmetry of the arrangement.

It is a prime object of the present invention to achieve a broadband frequency divider wherein a good isolation between the input and output frequencies is created through a bilaterally symmetrical design. The instant device operates over a wide bandwidth, up to or exceeding a waveguide bandwidth, and is able to do this at frequencies up to at least 18 GHz. In addition, the symmetry of the structure reduces the proportion of undesirable even-order harmonics (of the desired half-frequency) in the signal which is transmitted to the output port.

More specifically, the present invention resides in a microwave frequency divider of the type to divide by two a band of frequencies, comprising an input rectangular waveguide dimensioned to propagate a band of input frequencies; an elongated slot substantially centered in one broadwall of said input rectangular waveguide, the slot substantially extending in parallel with a normal propagation direction of an input $TE_{10}$ mode wave; a pair of nonlinear capacitive reactance elements symmetrically and operatively disposed one along either long side of said slot so as to form therewith a resonance loop at subharmonic frequencies of about half the microwave frequencies of the input band; and an output rectangular waveguide dimensioned to propagate a band of said subharmonic frequencies and so disposed about said input waveguide and said slot as to define an output wave propagation direction substantially perpendicular to the propagation direction of the input wave.

Preferred embodiments of the present invention will be hereinafter described with reference to the accompanying drawings, wherein FIG. 1 illustrates a first embodiment of the microwave frequency divider according to the present invention;

Figure 1:
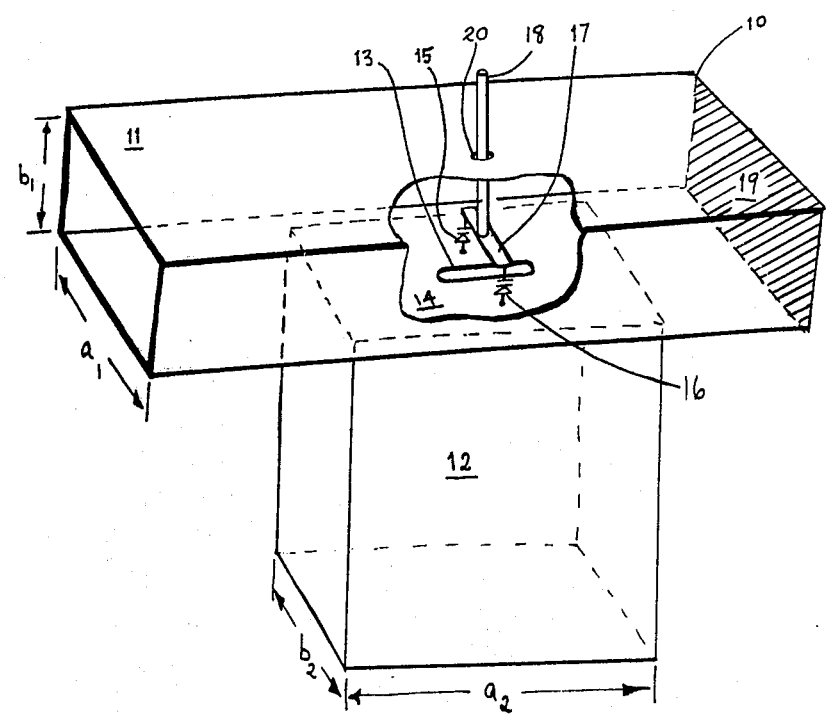

Referring to FIG. 1 there is shown one embodiment of the balanced frequency divider circuit 10 according to the present invention. An input rectangular waveguide 11 has broad-walls of length $a_1$ and side-walls of length $b_1$ and is so-dimensioned as to allow the propagation of an input signal at frequency f in the fundamental $TE_{10}$ mode. A larger output rectangular waveguide 12 has broad-walls and side-walls dimensions $a_2$ and $b_2$, respectively, and so-dimensioned as to propagate an output signal at frequency $\frac{1}{2}f$ also in the same fundamental $TE_{10}$ mode. A coupling slot 13 is made in the wall surface 14 common to the two waveguides 11 and 12. In the shown arrangement, the input waveguide 11 and the output waveguide 12 are oriented with respect to one another so that the axes of propagation of the input and output frequencies are set at right angles or, in other terms, the side-wall dimension $b_2$ of the output guide is parallel to the broad-wall dimension $a_1$ of the input guide. In addition, an adjustable short-circuit 19 is provided at the end of the input waveguide 11 opposite to its input port.

A matched pair of nonlinear capacitive reactance elements 15 and 16 is symmetrically set one on each side of the coupling slot 13, one electrode of each of the reactance elements being electrically connected to the common wall 14 along the long edges of the coupling slot 13 whereas the other electrodes of the reactance elements 15 and 16 are connected each to one end of a bridge element 17. That bridge element 17 forms with the electrically conducting surface 14 a transmission line which will propagate energy to and fro between the two reactance elements 15 and 16, which propagation is perpendicular to the normal $TE_{10}$ mode of propagation in the input waveguide 11. Moreover, the reactance elements 15 and 16 which are both oriented in the same polarity form together with the transmission line made up of the bridge element 17 and the surface 14, a series or loop resonant circuit at a frequency which is a subharmonic frequency of the input signal. Indeed, where a resonance frequency $f_o$ is desired, the required phase length $2\theta$ of the bridge element 17 is given by:

$$\tan \theta = \frac{\omega_o Z_o (C_o + 2C_s)}{2(\omega_o Z_o)^2 C_o C_s - 1}$$

where, $\omega_o = 2\pi f_o$ $C_o$ = is the effective small signal capacitance of each one of the nonlinear capacitive reactances 15 and 16

$C_s$ = is the effective capacitance of the coupling slot 13

$Z_o$ = is the characteristic impedance of the transmission line formed by elements 17 and 14.

It is to be noted that the post 18 linked to the bridge element 17 does not influence the resonance frequency $f_o$ because that post is connected to a voltage null point.

In that configuration, resonance occurs when the voltages developed across the two reactance elements 15 and 16 at frequency $f_o$ are equal in amplitude but opposite in sign, i.e. an odd mode resonance is excited and introduced in the so-formed loop.

To achieve division by two, the signal resonant frequency $f_o$ is set at or near half the input frequency f. Indeed, the electric field vector of the input wave induces a current at frequency f in post 18 so that the two elements 15 and 16 are excited in an even mode. Thus, at frequency f, the voltages developed across the elements 15 and 16 are equal in both amplitude and sign. Residual thermal noise in the series resonant circuit will include a frequency component at the frequency $\frac{1}{2}f$. Due to the nonlinear reactance property of the elements 15 and 16, there exists a parametric coupling mechanism between the input frequency f and the output frequency $\frac{1}{2}f$. That coupling mechanism causes energy to be continuously transferred from the frequency f to the subfrequency $\frac{1}{2}f$. The amplitude of this alternating subharmonic signal grows with time until a final steady value is reached. Since an alternating current is developed in the series resonant circuit at $\frac{1}{2}f$, it follows that a corresponding potential difference will be developed between the long sides of the slot 13. The electric field across that slot 13 has the appropriate orientation required for launching a $TE_{10}$ wave at $\frac{1}{2}f$ in the output waveguide 12.

Moreover, the junction area between the input and output waveguides 11 and 12 may form an iris at the launching end of the output waveguide 12.

It is to be noted that the input frequency is suitably isolated from the output waveguide 12 since, when the input signal at frequency f excites the two nonlinear reactance elements 15 and 16, they are excited in an even mode at the frequency f and then no potential difference appears across the coupling slot 13 at that frequency f. But, when the tuned circuit resonates at a frequency at or near $\frac{1}{2}f$, the potentials on the two nonlinear reactance elements 15 and 16 are 180° out of phase and then a subharmonic oscillation exists as an odd mode. It is that potential difference developed across the coupling slot 13 at a frequency $\frac{1}{2}f$ which sets up an electric field which propagates through the output waveguide 12.

Moreover, it is important to note that coupling of energy between the input frequency f and the output frequency $\frac{1}{2}f$ occurs only through the phenomenon of parametric subharmonic generation which depends exclusively on the provision of non-linear reactances. Indeed, no such coupling would exist if the elements were replaced by linear reactances or nonlinear resistances.

Because of the balanced structure of the divider, even order harmonics of the output frequency $\frac{1}{2}f$, namely, f, 2f, 3f, 4f ..., are suitably suppressed with respect to the desired output signal $\frac{1}{2}f$. Such suppression of f, which is equal to the input frequency, alleviates the filtering problem which would otherwise exist, particularly where the bandwidth of operation is broad.

Additionally, the distance between the short-circuit 19 and the series resonant circuit is made adjustable to achieve satisfactory matching. A typical separation is of the order of a quarter wavelength at the frequency f. Furthermore, a DC bias voltage may be applied to the elements 15 and 16 by means of the post 18 which projects through a hole 20 in the broadwall of waveguide 11 opposite that bearing the coupling slot 13. However, a choke structure may be provided so that electrical energy at frequencies appreciably greater than zero cannot escape through the hole 20. But, where the frequency divider is operated with a zero bias on elements 15 and 16, the post is then electrically connected to the waveguide wall and such a hole 20 is not required.

It is to be noted that when the input power level is small, frequency division will then be achieved over a relatively narrow bandwidth in the vicinity of the small signal subharmonic resonance frequency. However, when the input power exceeds a predetermined threshold level, then the bandwidth of operation will expand considerably. The expansion will occur predominantly towards the lower frequencies of operation. In either case, the bandwidth may be maximized by setting the small signal resonant frequency of the loop at a value slightly higher than the maximum value of $\frac{1}{2}f$ and by making the resonant loop as small as physically possible through the use of nonlinear reactance elements which are compact and present relatively large capacitances.

Figure 2:
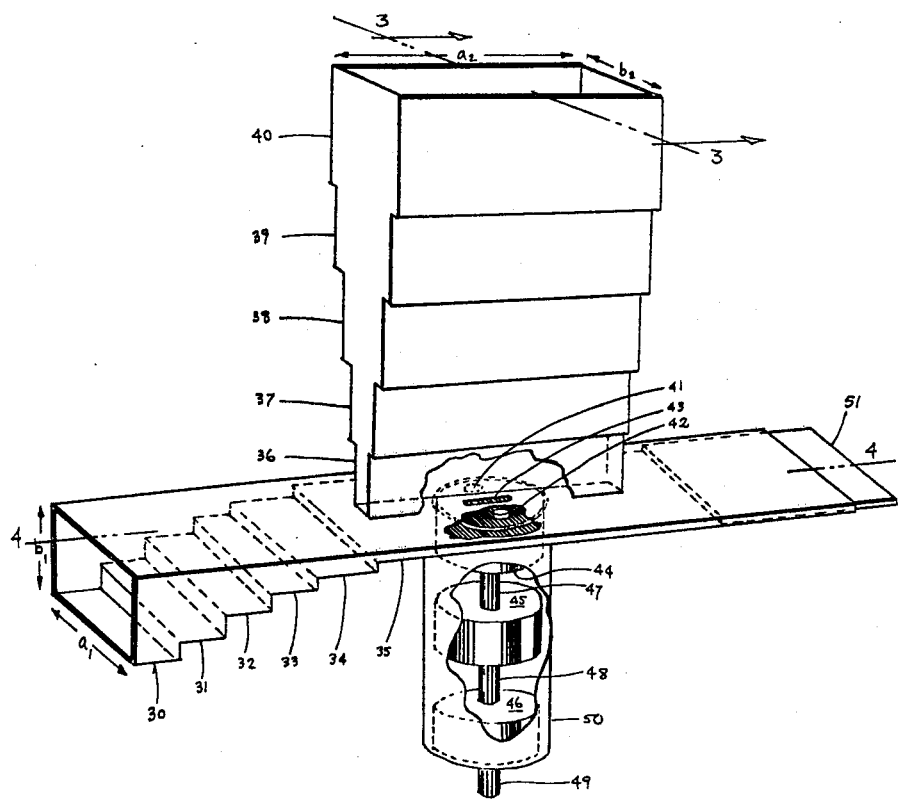
FIG. 2 shows another embodiment of the microwave frequency divider according to the present invention.
Figure 3:
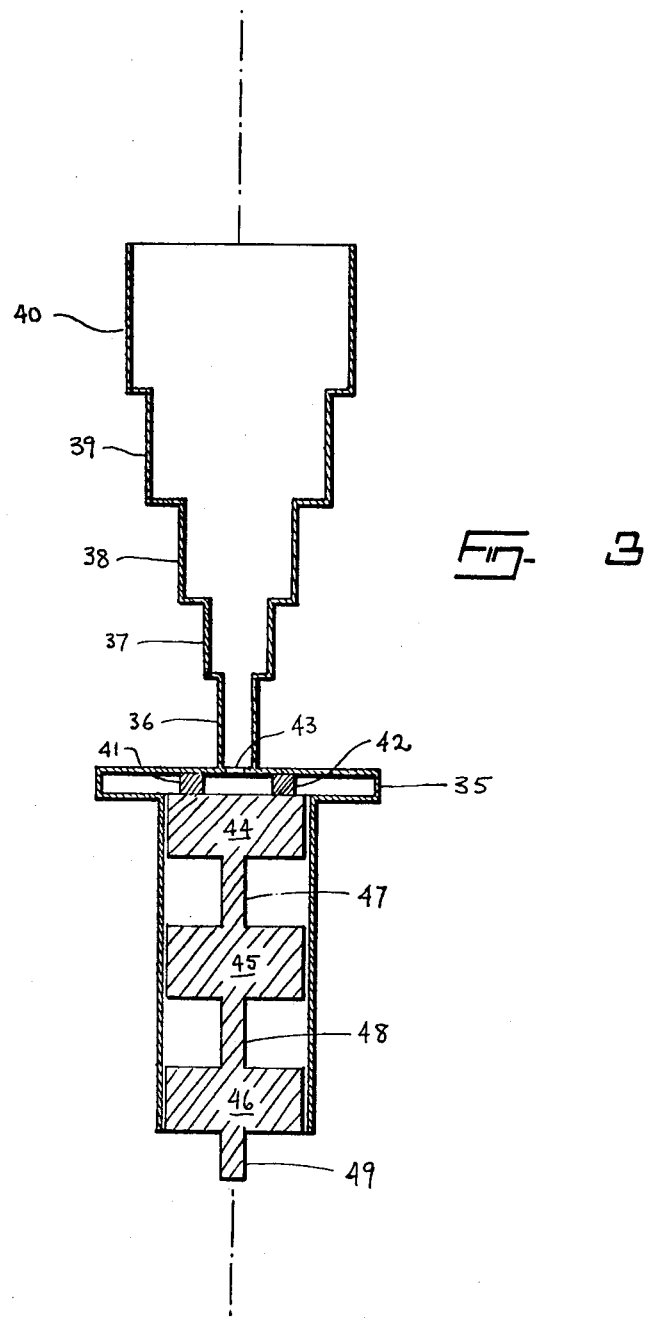
FIG. 3 is a cross-sectional view of the microwave frequency divider of FIG. 2, taken along line 3—3.
Figure 4:
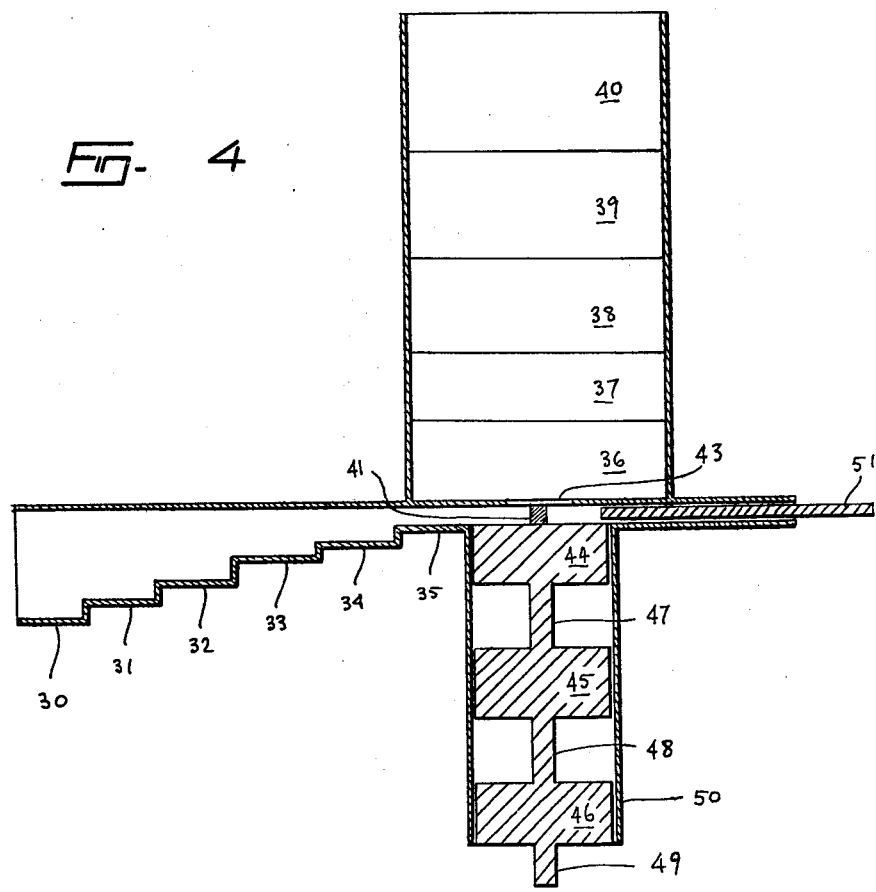
FIG. 4 is another cross-sectional view of the frequency divider of FIG. 2, taken along line 4—4.

FIGS. 2, 3 and 4 illustrate a variant embodiment of the basic balanced frequency divider shown in FIG. 1. In order to show all the parts clearly, FIG. 2 has been drawn inverted compared with FIG. 1 whereas FIGS. 3 and 4 are cross-sectional views thereof taken along lines 3—3 and 4—4, respectively. The input part of the divider consists of a first rectangular waveguide 30 with inside dimensions $a_1$ and $b_1$ proportioned to propagate an input frequency f of a bandwidth $\Delta f$, an impedance transformer of the Chebychev type composed of a plurality of asymmetrical homogeneous reduced-height waveguide sections 31, 32, 33 and 34, and a reduced-height waveguide 35. At the end of the waveguide 35, there is an adjustable short-circuit 51. The output part consists of a larger rectangular waveguide 40 with inside dimensions $a_2$ and $b_2$ proportioned to propagate an output frequency $\frac{1}{2}f$ of a bandwidth $\frac{1}{2}\Delta f$ and an impedance transformer composed of a plurality of symmetrical homogeneous reduced-height waveguide sections 36, 37, 38 and 39.

As in the basic configuration of FIG. 1, an elongated coupling slot 43 is provided in one broadwall of the reduced-height waveguide 35, that wall being common to both input and output guides. But in the shown arrangement, there is no bridge element 17, as in FIG. 1. Instead, the two nonlinear capacitive reactance elements 41 and 42 are connected directly between the two parallel broadwalls of waveguide 35, symmetrically mounted one on each side of the coupling slot 43.

Moreover, in order to reduce the threshold input power required for broadband operation, it is desirable to apply forward DC bias to the two reactance elements 41 and 42. For that purpose, a coaxial choke structure is provided. That choke is made up of a plurality of coaxial-line sections 44, 47, 45, 48 and 46 of alternately high and low characteristic impedance, contained within a concentric cylinder 50. The cylinder 50 is fixed to the broadwall of waveguide 35 on the side opposite that carrying the coupling slot 43, so that its axis is collinear with the plane of symmetry of the input waveguide structure. The coaxial choke structure composed of sections 44, 47, 45, 48 and 46 is also used to apply mechanical pressure to the two reactance elements 41 and 42, thereby ensuring good electrical contacts.

In a manner well known in the art, such a choke structure can be designed to permit the flow of energy below a certain frequency, but impede greatly the energy-flow above that frequency. In practice, the choke is designed so as to block all frequencies from the lowest output frequency to the highest input frequency, as a minimum requirement. To obtain operation free from spurious responses, it is desirable to include additional components connected between section 49 and the cylinder 50 such as resistive energy-absorbing material and capacitance elements, to prevent the flow of energy down to very low frequencies.

To clarify the details of the structure shown in FIG. 2, there is shown in FIG. 3 a cross section of the structure taken through the two nonlinear reactance elements 41 and 42, along line 3—3. This figure shows how the height of the reduced-height waveguide section 35 is chosen to agree with the length of the nonlinear elements 41 and 42. FIG. 4 is a cross section of the structure at the plane of symmetry along line 4—4 of FIG. 2. The numbers used in FIGS. 3 and 4 agree with those in FIG. 2.

The input frequency is isolated from the output waveguide 40 and the output frequency is isolated from the input waveguide 30 through the following mechanisms. Because of the bilaterally symmetrical structure and the balanced subharmonic resonator, even-mode excitation of the nonlinear reactances 41 and 42 at the frequency f cannot develop any appreciable potential difference at that frequency across slot 43. Hence, the input frequency f is not launched towards the output waveguide 40. Moreover, in the waveguide section 35, the subharmonic frequency $\frac{1}{2}f$ is generated transversely, which is perpendicular to the normal $TE_{10}$ mode of propagation therein. Furthermore, the waveguide sections 30, 31, 32, 33, 34 and 35 are dimensioned so that their low frequency cutoff occurs at a frequency greater than the highest required value of $\frac{1}{2}f$. These last two mechanisms prevent the output frequency $\frac{1}{2}f$ from being propagated backwards towards the input waveguide 30.

Figure 5:
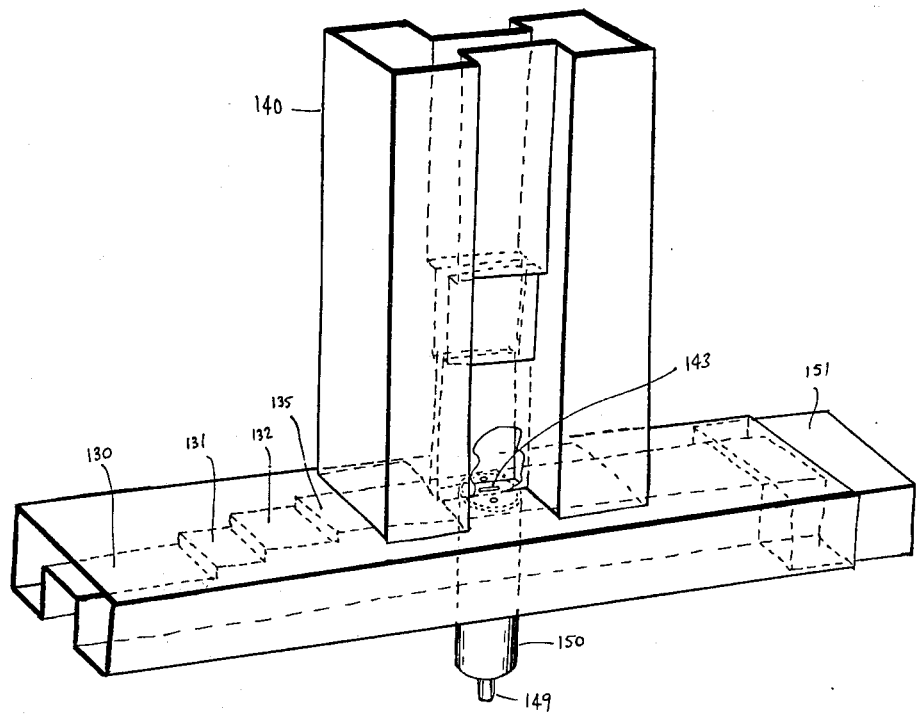
FIG. 5 depicts a further embodiment of the microwave frequency divider according to the present invention.

In general, the bandwidth obtainable from a frequency divider constructed according to FIGS. 1–4, will be limited by the bandwidths of operation of the primary and secondary waveguides. It is contemplated that a wider bandwidth of operation, even exceeding one octave, can be realized by replacing the rectangular waveguides by ridged waveguides. Referring to FIG. 5 the topology of the structure requires that the input waveguide be replaced by a single-ridged waveguide 130 and that the output waveguide be replaced by a double-ridged waveguide 140. The nonlinear reactance elements are then mounted between the reduced height ridge 135 and the opposite unridged broadwall. The unridged broadwall of reduced-height guide 135 contains a slot 143 as already described.

Because the ridge reduces the effective height of the first waveguide, fewer impedance-transformer sections 131, 132 are required. Since the electric field is concentrated between the ridge and the opposite broadwall, only the ridge itself need be stepped.

To retain the required symmetry the output waveguide 140 is of a double-ridge construction. The space between the two ridges effectively reduces the height of the second waveguide, so that again fewer impedance-transformer sections are required.

Apart from the appropriately-shaped adjustable short circuit 151, the other structural features of the frequency divider of FIG. 5 are as described above.

Models of the microwave frequency dividers according to the embodiments of FIGS. 1, 2, 3 and 4 have actually been created and carefully tested. The divider constructed according to FIG. 1 translated the 15.0–17.5 GHz input band down to an output band of 7.5–8.75 GHz, while the divider constructed according to FIG. 2 translated the full 12.4–18.0 GHz waveguide band ($K_u$-band) down to the output band of 6.2–9.0 GHz. For an input frequency of 14 GHz, the RF pulse-risetime of this second divider was measured to be of the order of 1 nanosecond. The total delay (90% input to 90% output) was approximately of 4 nanoseconds. It is furthermore contemplated that the present divider can be designed to achieve division-by-two operation for input frequencies in excess of 100 GHz. In all cases, due to the bilaterally symmetrical configuration of the present divider, outstanding isolation between the input and output frequencies has been obtained.

The instant microwave frequency divider finds important applications where RF-pulse or CW signals have to be translated to a lower frequency domain, in extending the range of frequency counters, or where microwave sources have to be locked to lower-frequency references. A further application is carrier-recovery in microwave PSK (phase-shift-keying) systems.

I claim:
1. A microwave frequency divider, comprising:
an input rectangular waveguide dimensioned to propagate a band of input frequencies;
an elongated slot substantially centered in one broadwall of said input rectangular waveguide, the slot substantially extending in parallel with a normal propagation direction of an input $TE_{10}$ mode wave;
a pair of nonlinear capacitive reactance elements symmetrically and operatively disposed one along either long side of said slot so as to form therewith a resonance loop turned at subharmonic frequencies of about half the microwave frequencies of the input band; and
an output rectangular waveguide dimensioned to propagate a band of said subharmonic frequencies and so-disposed about said input waveguide and said slot as to define an output wave propagation direction substantially perpendicular to the propagation direction of the input wave.

2. A frequency divider as claimed in claim 1, characterized in that said nonlinear capacitive reactance elements are oriented in a common polarity direction and have first terminals directly connected on to said one broad-wall of the input waveguide and second terminals directly connected onto the wall opposite said one broad-wall.

3. A frequency divider as claimed in claim 1, characterized in that said pair of nonlinear capacitive reactance elements are oriented in a same polarity direction and have first terminals directly connected to said one broad-wall of the input waveguide and second terminals connected to an elongated conductive bridge element which is disposed orthogonally to said normal propagation direction, in the input waveguide, a conductive post being electrically connected substantially at the center of said conductive bridge element and extending through the broad-wall opposite to said one broad-wall, and means for applying a DC bias voltage to said conductive post and therefore across said nonlinear capacitive reactance elements.

4. A frequency divider as claimed in claim 1, 2 or 3, further comprising an adjustable short circuit element located at one extremity of said rectangular input waveguide.

5. A frequency divider as claimed in claim 1, characterized in that said output waveguide is so-mounted perpendicularly to said one broad-wall of said input rectangular waveguide as to define a junction area wherein said elongated slot is substantially centered.

6. A microwave frequency divider, comprising an input rectangular waveguide including parallel broad-walls and parallel side-walls, said input waveguide being so-dimensioned as to propagate a band of input frequencies through an input port;

an elongated slot substantially centered in one of said broad-walls, said slot substantially extending in parallel with a normal propagation direction of an input $TE_{10}$ mode wave;

a pair of nonlinear capacitive reactance elements symmetrically and operatively set one on each long side of said slot so as to form therewith a resonance loop at subharmonic frequencies of about half the microwave frequencies of said input band, said reactance elements being oriented in a like polarity direction;

an elongated conductive bridge element interconnecting corresponding terminals of said pair of non-linear capacitive reactance elements, said bridge element being mounted orthogonally with respect to said normal propagation direction;

a conductive post substantially connected to the center of said conductive bridge element and extending through the other of said broad-walls;

means for preventing leakage of substantial microwave energy between said post and said other broad-wall and for applying a DC bias voltage across said pair of nonlinear capacitive reactance elements;

an adjustable short circuit element provided at an extremity opposite to said input port of said input waveguide;

an output rectangular waveguide including parallel broad-walls and parallel side-walls, said output waveguide being so-dimensioned as to propagate a band of said subharmonic frequencies and so-disposed about said input waveguide and said slot as to define an output wave propagation direction substantially perpendicular to the propagation direction of the input wave, said elongated slot being substantially centered in the cross-sectional area of said output waveguide.

7. A microwave frequency divider, comprising a primary reduced-height rectangular waveguide, having first and second elongated wall members and two reduced-height side-wall members, dimensioned to propagate a first band of microwave frequencies and having an elongated slot substantially centered in said first elongated wall member, said slot extending in parallel with a normal $TE_{10}$ mode propagation direction thereof;

an asymmetrical homogeneous waveguide input transformer, consisting of a plurality of waveguide sections having successively graduated side-wall dimensions, being proportioned to effect an electrical match over said band of input frequencies, between said primary reduced-height waveguide and a full-height input waveguide;

a pair of nonlinear capacitive reactance elements symmetrically set one on each side of said slot, a first electrode of each of said elements being electrically connected to said first elongated wall member, a second electrode of each of said elements being electrically connected directly to said second elongated wall member, the spacing between said elongated wall members being substantially equal to the height of said nonlinear capacitive reactance elements, said reactance elements forming with said slot a resonant loop tuned at subharmonic frequencies of about half said input frequencies;

a reduced-height adjustable short circuit located at one end of said primary reduced-height waveguide;

a secondary reduced-height rectangular waveguide having two elongated wall members and two reduced-height side-wall members, dimensioned to propagate a second band of output frequencies corresponding to said subharmonic frequencies in a propagation direction substantially orthogonal to said normal propagation direction of said primary waveguide, the elongated cross-sectional dimension thereof being parallel with said normal propagation direction of said primay waveguide, the junction thereof with said primary waveguide being substantially centered on said elongated slot; and a symmetrical waveguide output transformer, consisting of a plurality of waveguide sections having successively graduated side-wall dimensions, being proportioned to effect an electrical match over said band of output frequencies, between said secondary reduced-height waveguide and a full-height output waveguide.

8. A microwave frequency divider as claimed in claim 7, wherein the second electrode of each of said nonlinear reactance elements is electrically connected to one end of a choke structure to convey DC bias voltage to said nonlinear reactance elements while at the same time impeding the flow of alternating currents therein.

9. A microwave frequency divider as claimed in claim 7 or 8, wherein the primary reduced-height waveguide comprises an asymmetical reduced-height single-ridged waveguide, and wherein the secondary reduced-height waveguide comprises a symmetrical reduced-height double-ridged waveguide, said primary asymmetrical reduced-height single-ridged waveguide being electrically matched over a wider first band of input frequencies to a full height single-ridged input waveguide by means of a transformer consisting of a plurality of asymmetrical single-ridged waveguide sections having successively graduated ridge heights, said secondary symmetrical reduced-height double-ridged waveguide being electrically matched over a wider second band of output frequencies to a full-height double-ridged output waveguide by means of a transformer consisting of a plurality of symmetrical double-ridged waveguide sections having successively graduated ridge heights.

* * * * *